United States Patent [19]

Solie

[11] 4,016,513
[45] Apr. 5, 1977

[54] SURFACE WAVE CONVOLVER APPARATUS

[75] Inventor: Leland P. Solie, Acton, Mass.

[73] Assignee: Sperry Rand Corporation, New York, N.Y.

[22] Filed: Dec. 4, 1975

[21] Appl. No.: 637,542

[52] U.S. Cl. ............................ 333/30 R; 235/181; 330/5.5; 333/72

[51] Int. Cl.² ..................... H03H 9/26; H03H 9/30; G06G 7/19; H03F 7/00

[58] Field of Search ............ 333/72, 30 R; 178/7.1; 310/8–8.3, 9.7, 9.8; 235/181

[56] References Cited

UNITED STATES PATENTS

| 3,816,753 | 6/1974 | Kino | 235/181 X |
| 3,833,867 | 9/1974 | Solie | 333/30 R |
| 3,851,280 | 11/1974 | Staples | 333/30 R |

Primary Examiner—Craig E. Church
Assistant Examiner—Marvin Nussbaum
Attorney, Agent, or Firm—Howard P. Terry; Seymour Levine

[57] ABSTRACT

Apparatus for convolving acoustic surface waves without dispersion comprising a piezoelectric substrate having surface acoustic waves generated at opposite ends thereof and directed towards an interaction region formed from a semiconductor film deposited thereon. The film is deposited on the substrate at such an angle with respect to the direction of propagation of each of the two acoustic surface waves so that the dispersive components of the wave vectors associated with the surface acoustic waves refracted in the interaction region substantially cancel. Apparatus is also disclosed for substantially eliminating undesired wave reflections in a convolver operating in the degenerate mode wherein a conductive array of electrode fingers is disposed at an angle with respect to the direction of propagation of the acoustic surface waves such that the reflections therefrom are directed away from the paths traversed by said acoustic surface waves.

22 Claims, 2 Drawing Figures

SURFACE WAVE CONVOLVER APPARATUS

BACKGROUND OF THE INVENTION

1. Field of the Invention

The invention relates to acoustic surface wave convolvers and more particularly to apparatus therein for eliminating in the interaction region the distortive effects of dispersion and reflection.

2. Description of the Prior Art

Acoustic surface wave convolvers in the prior art, particularly the convolver disclosed in Applicant's U.S. Pat. No. 3,833,867 entitled "Acoustic Surface Wave Convolver with Bidirectional Amplification," and assigned to the assignee of the present invention, typically include an interaction region comprised of a semiconductor film overlay on a piezoelectric body. Moreover, the semiconductor film has traditionally been deposited on the body such that the plane defined thereby is coincidental with the plane defined by the parts traversed by the propagating acoustic surface waves. Since the interaction region represents a change in the medium through which the acoustic surface waves must traverse, and because the film-on-substrate geometry is dispersive, the respective velocities and wave vectors associated with each of the propagating acoustic surface waves must therefore change thereby inducing phase delays in the interaction region.

The dispersion of the surface waves can be expressed in terms of the parameter which is the fractional change in phase delay per unit change in frequency, i.e.,:

$$\gamma = (1/\tau)(\delta\tau/\delta f). \quad\quad 1.$$

Over a bandwidth $\Delta f$, the deviation in time delay is $\Delta\tau$, therefore, equation (1) may be rewritten as, $$\gamma = (1/\tau)(\Delta\tau/\Delta f). \quad\quad 2.$$

The time bandwidth, TB, of the device, which is a measure of the product of the transversal time of the signal through the interaction region and the bandwidth of the launching devices may be represented by:

$$TB = \tau\Delta f = \Delta\tau/\gamma. \quad\quad 3.$$

In order to maintain phase coherence across the output structure or interaction region, it is desirable to maintain the deviation in delay time $\Delta\tau$ below 1 RF period, thus:

$$\Delta\tau \leq 1/f, \text{ and} \quad\quad 4.$$

$$TB = \leq 1/\gamma f \quad\quad 5.$$

Accordingly, it can be appreciated that the dispersion experienced in the interaction region seriously limits the usefulness of the device since the time bandwidth product TB is inversely proportional thereto.

The prior art acoustic surface wave convolvers with interdigital center structures have also been traditionally limited to operation in the non-degenerate mode, i.e., where the frequencies of the two input signals are unequal. Operation in this mode requires precise spacing of the electrode fingers such that:

$$2d = \frac{2\pi}{k_3} = \frac{2\pi}{|k_1 - k_2|} \quad\quad (6)$$

where $k_3$ is the wave number (or wave vector) of the sum frequency signal $\omega_3$ developed in the convolver, $k_1$ and $k_2$ are the wave numbers (or wave vectors) of the two input signals at $\omega_1$ and $\omega_2$, respectively, and $d$ is the center-to-center spacing between successive electrode fingers of the interdigital center structure. Moreover, each electrode finger must be disposed such that it lies normal to the direction of the wave vector $k_3$ of the product or convolution signal. Since the electrode fingers of the interdigital structure are normal to the direction of travel of the propagating acoustic surface waves, the reflections therefrom will be directed along the same paths traversed by the propagating acoustic surface waves. The effect is to introduce a number of stop bands in the frequency response and thus significantly reduce the effective bandwidth of the convolver. These reflections are not coherent but nonetheless contribute to the spurious signal level in the convolution signal and they have proven to be very difficult to eliminate in the nondegenerate mode of operation.

SUMMARY OF THE INVENTION

The apparatus of the present invention eliminates the foregoing problems thereby increasing the effective time bandwidth TB of the convolver and increasing the convolution efficiency of the device.

More particularly, the apparatus comprises a surface wave convolver having a piezoelectric body for propagating surface acoustic waves. A film of semiconductor material deposited thereon forms an interaction region or output structure for convolving the signals and is disposed at angles with respect to directions of propagation of the acoustic surface waves. Additionally, the angles are selected such that the dispersive components of the wave vectors associated with acoustic waves refracted in the interaction region are substantially cancelled or minimized thereby yielding a convolution or output signal which is the product of the non-dispersive components thereof.

The invention also comprises apparatus for minimizing the reflections from the center structure or interaction region of the convolver. Specifically, if the convolver is operated in the degenerate mode, i.e., where the frequencies of the propagating surface acoustic waves are equal, the electrode fingers of the conductive arrays disposed within the interaction region may be situated at an angle with respect to the direction of propagation of the acoustic waves. The conductive array is comprised of a plurality of electrode fingers which support alternating unidirectional electric fields for amplifying the propagating surface acoustic waves and for detecting the convolution thereof. Each electrode finger is uniformly disposed at an angle with respect to the directions of propagation of the acoustic surface waves such that any reflections therefrom are directed away from the paths traversed thereby resulting in a lower level of spurious signal and thus an increased effective time bandwidth TB of the device. Additionally, the spacing of the electrode fingers is independent of the frequencies of the propagating acoustic surface waves in contrast to operation in the non-degenerate mode.

DESCRIPTION OF THE PREFERRED EMBODIMENT

Figure 1:
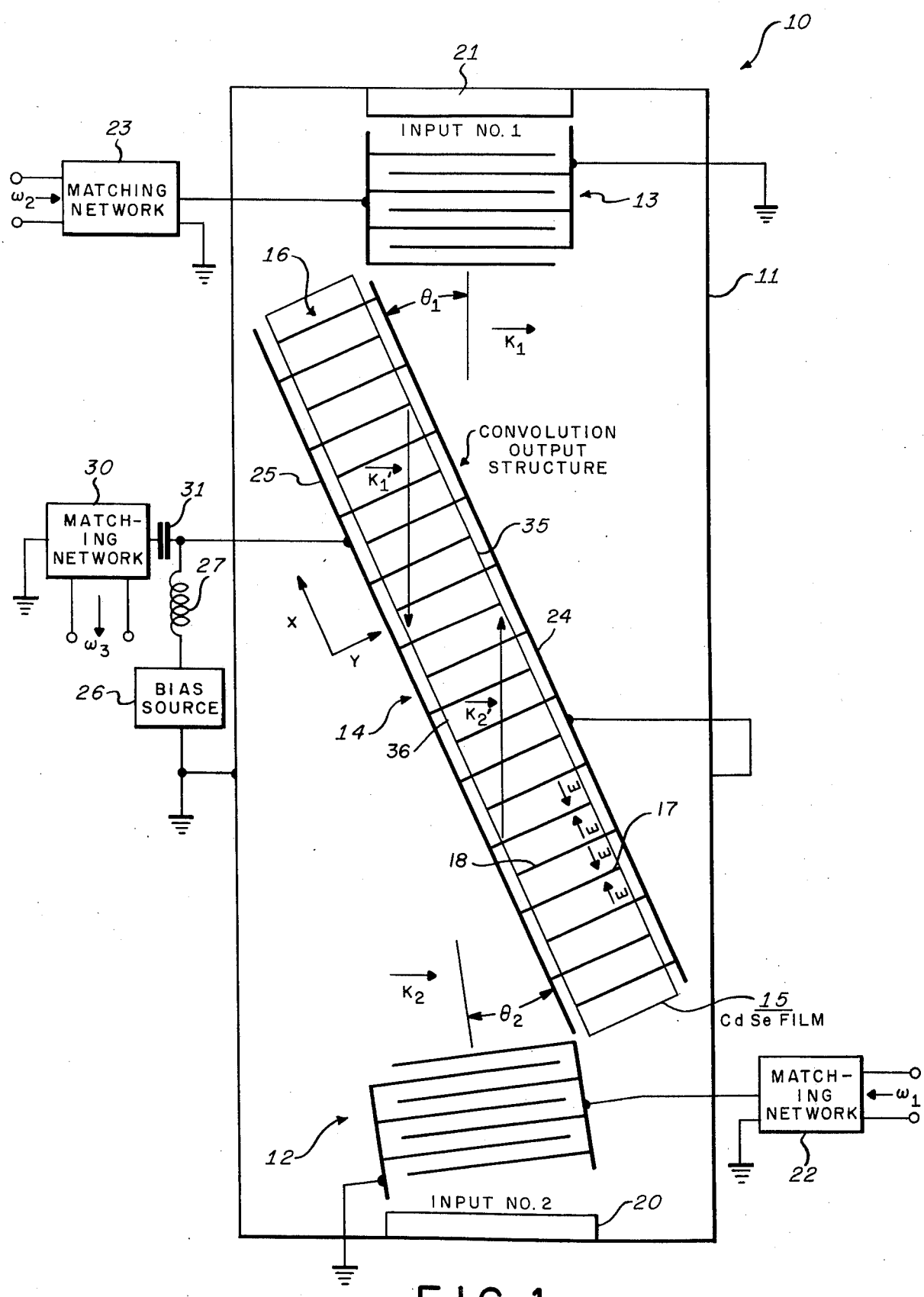
FIG. 1 is an illustration of one embodiment of the present invention partly comprising a block-schematic diagram and partly comprising a plan-view of the convolver in which the semiconductor film and the conductor array are disposed at angles with respect to the directions of propagation of the acoustic surface waves.

Referring now to FIG. 1, the first embodiment 10 of the present invention is illustrated. In particular, the body or substrate 11, preferably formed from an elongate slab of Y-cut LiNbO$_3$, comprises the medium over which the acoustic surface waves will propagate. A pair of launching input transducers 12 and 13, fabricated in a manner similar to their counterparts in U.S. Pat. No. 3,833,867, are disposed at either end of the substrate 11. In response to appropriate input signals, the launching input transducers 12 and 13 each generate an acoustic surface wave which will propagate along the substrate 11 in the directions indicated by wave vectors $\vec{k}_2$ and $\vec{k}_1$, respectively. An output structure or interaction region 14 is formed on the substrate 11 by the deposition thereon of a thin semiconductor film overlay 15, preferably CdSe, in the manner described in U.S. Pat. No. 3,833,867. Situated on the top of the semiconductor film 15 is a conductive array 16 of interdigital electrode fingers, such as electrode fingers 17 and 18, which are fabricated in a manner similar to that utilized for input transducers 12 and 13. A pair of acoustic absorbers 20 and 21, which may be fabricated from a thin film of a suitable acoustic absorbing material such as wax, rubber, etc. are provided at either end of the substrate 11 to absorb undesired acoustic waves generated by launching input transducers 12 and 13.

The input signals, represented by their respective center frequencies $\omega_1$ and $\omega_2$, which will be convolved by the apparatus, may be applied to conventional matching network circuits 22 and 23, respectively, or directly coupled to the input transducer 12 and 13, respectively. The output from matching network 22 is coupled to input transducer 12 and similarly the output from matching network 23 is coupled to input transducer 13. A pair of buss bars or conductors 24 and 25, fabricated by the same technique utilized with respect to the electrode fingers, are each separately coupled to alternate electrode fingers of the conductive array 16. For example, conductor 24 is coupled to electrode 18 while conductor 25 is coupled to electrode 17. A bias voltage is applied across the conductors 24 and 25, as described in U.S. Pat. No. 3,833,867, to amplify, or as the case may be, to minimize attenuation of the propagating acoustic surface waves in the interaction region 14. The bias voltage, which may be direct or pulsating, is provided by bias source 26 and coupled to the conductors 24 and 25 through inductor 27. Since the conductors 24 and 25 also sum the components of the product or convolution signal, a matching network 30 is coupled thereto to detect the desired convolution signal represented by $\omega_3$ where $\omega_3 = \omega_1 + \omega_2$. A blocking capacitor 31, serially connected between matching network 30 and conductor 25, is utilized to block or isolate from the output signal the d.c. bias voltage generated by the bias source 26.

As previously indicated, the monolithic structure, i.e., the film-on-substrate geometry, of the surface wave convolver is dispersive, that is, the surface wave velocities of the acoustic surface waves will change in the interaction region depending on the frequency of the input signals to be convolved. This dispersion results in phase errors in the interaction region, a reduced time bandwidth TB, and distortion of the convolution signal.

Typically, in convolvers operated in the non-degenerate mode, i.e., where $\omega_1 \neq \omega_2$, the directions of propagation of the acoustic surface waves represented by wave vectors $\vec{k}_1$ and $\vec{k}_2$ and the plane in which the center structure 14 is disposed are parallel and coincident. The frequency of the output or convolution signal $\omega_3$ is equal to the sum of its components $\omega_1 + \omega_2$ and the wave vector $\vec{k}_3$ of the convolution signal is equal to $\vec{k}_1 - \vec{k}_2$ where $\vec{k}_3$ is colinear with $\vec{k}_1$ and $\vec{k}_2$. The wave vector or wave number $\vec{k}_3$ is utilized to determine the center-to-center spacing between successive electrode fingers in the conductive array 16. More particularly, the spacing between electrode fingers $d$ may be represented by the relation:

$$d = \pi/k_3. \qquad 7.$$

In the present invention, the center structure 14 is disposed at an angle $\theta_1$ with respect to the direction of propagation of the acoustic surface wave associated with wave vector $\vec{k}_1$ and at a second angle $\theta_2$ with respect to the direction of propagation of the wave associated with wave vector $\vec{k}_2$. The plane defined by the disposition of the center structure 14 may be described in terms of the $x,y$ coordinate system, as shown in FIG. 1, wherein the $x$ coordinate is parallel to surfaces 35 and 36 of semiconductor film 15. The wave vectors of the propagating acoustic surface waves introduced or refracted in the center structure 14 as a result of the impingement thereof by the propagating surface acoustic waves are denoted as $\vec{k}_2{}'$ and $\vec{k}_1{}'$. Since the wave vectors $\vec{k}_1$, $\vec{k}_1{}'$, $\vec{k}_2$ and $\vec{k}_2{}'$ are vectors, each may be represented by a component situated along the $x$ axis, a component situated along the $y$ axis, such that $$|k_1|^2 = k_{1x}{}^2 + k_{1y}{}^2, \ |k_2|^2 = k_{2x}{}^2 + k_{2y}{}^2, \ |k_1'|^2 = k_{1x}'{}^2 + k_{1y}'{}^2, \ \text{and} \ |k_2'|^2 = k_{2x}'{}^2 + k_{2y}'{}^2. \qquad 8.$$

Consider now the relationship between the vector components $k_{1x}$ and $k_{1x}{}'$ of the wave vectors $\vec{k}_1$ and its counterpart in the interaction region $\vec{k}_1{}'$. Snell's law requires that the tangential component of the wave vector be continuous at the boundary or interface between the two acoustic mediums. As depicted in FIG. 1, the interface with respect to vector components $k_{1x}$ and $k_{1x}{}'$ is the plane, normal to the surface of the substrate 11, defined by the edge 35 of the semiconductor film 15. Furthermore, $x, y$ coordinate system has been selected so that the $x$ coordinate is parallel with the plane defined by edge 35.

Snell's law is given by the following relation:

$$\sin \theta_i / \sin \theta_t = \gamma t / \gamma i \qquad 9.$$

where $\theta_i$ is the angle of incidence, i.e., the angle between the normal to the interface and the incident wave; $\theta_t$ is the angle refraction, i.e., the angle between the normal to the interface and the refracted or induced wave; $\gamma_i$ is the velocity of the incident wave; and $\gamma_t$ is the velocity of the refracted wave. Since the velocity of the incident and refracted waves are inversely proportional to the wave vectors thereof, equation (9) may be rewritten as:

$$\sin \theta_i / \sin \theta_t = k_t/k_i \qquad 10.$$

where $k_i$ and $k_t$ are the wave vectors or wave numbers of the incident and the refracted waves, respectively. Substituting the tangential components $k_{1x}$ and $k_{1x}'$ of the wave vectors of the incident wave vector $\vec{k}_1$ and the refracted wave vector $\vec{k}_1'$, equation (10) yields $$\sin 90°/\sin 90° = k_{1x}/k_{1x}', \text{ and} \qquad 11.$$

$$k_{1x}' = k_{1x}. \qquad 12.$$

Since the acoustic surface wave represented by wave vector $k_1$ propagates along the substrate 11 only, it is non-dispersive and, therefore, $k_{1x}$ is also non-dispersive. Moreover, since Snell's law requires that the components $k_{1x}$ and $k_{1x}'$ be continuous, i.e., $k_{1x} = k_{1x}'$, then, the component $k_{1x}'$ along the x coordinate of wave vector $\vec{k}_1'$ must also be non-dispersive.

Utilizing the same analysis with respect to the x coordinate components, $k_{2x}$ and $k_{2x}'$ of the incident and refracted wave vectors $\vec{k}_{k2}$ and $\vec{k}_2'$ yields a similar result. Specifically, $k_{2x}$ is equal to $k_{2x}'$ and, more importantly, $k_{2x}'$ is non-dispersive.

Such is not the case, however, with respect to the y coordinate components $k_{1y}'$ and $k_{2y}'$ of the refracted wave vectors $\vec{k}_1'$ and $\vec{k}_2'$, respectively. Specifically, the y components of $\vec{k}_1'$ and $\vec{k}_2'$ are not continuous and, more importantly, are dispersive. However, in view of Snell's law, it is possible to choose the angles $\theta_1$ and $\theta_2$, depending on the frequencies of $\omega_1$ and $\omega_2$ of the acoustic surface waves such that the refracted components $k_{1y}'$ and $k_{2y}'$ of wave vectors $\vec{k}_1$ and $\vec{k}_2$, respectively, are equal and will cancel with respect to the wave vector $k_3$ of the product or convolution signal. The magnitude of $\vec{k}_3$, $|k_3|$, may then be expressed as:

$$|k_3|^2 = k_{3x}^2 + k_{3y}^2,$$

where $$k_{3x} = k_{1x}' - k_{2x}', k_{3y} = k_{1y}' - k_{2y}' = 0,$$

therefore $$k_3 = k_{3x} = k_{1x}' - k_{2x}' \qquad 13.$$

The product or convolution signal $\omega_3$, $\vec{k}_3$ will accordingly be detected by the electrode fingers of the conductive arrays 16 since the electrode fingers are disposed perpendicularly with respect to the x-coordinate components of the refracted wave vectors $\vec{k}_1'$ and $\vec{k}_2'$ comprising $k_3$. Additionally, the periodicity or electrode finger spacing of the output structure with respect to the electric field distribution of the product signal is given by the following relation:

$$d = \pi/k_{3x} \qquad 14.$$

where $d$ is the center-to-center spacing between the successive electrode fingers of the conductor array 16.

The present invention may also utilize the bidirectional amplification technique disclosed in U.S. Pat. No. 3,833,867. More particularly, by applying a d.c. or pulsating d.c. voltage to the conductors 24 and 25, a uniform unidirectional electric field is induced between each pair of electrode fingers of the conductor array such as electrode fingers 17 and 18. Furthermore, the unidirectional electric field will alternate uniformly between successive pairs of electrode fingers as indicated, for example, by the arrows labelled E in the vicinity of electrode fingers 17 and 18. As explained in much greater detail in U.S. Pat. No. 3,833,867, acoustic surface waves propagating in the interaction region will be alternately amplified and attenuated, depending on the direction of propagation of the acoustic wave. By appropriately selecting the bias voltage applied to the conductors 24 and 25, the gain in the region where the acoustic waves are amplified will substantially exceed the loss in the regions where the acoustic waves is attenuated thereby resulting in a net gain over the course of the interaction region 14.

Since the interaction region 14 is disposed at angles $\theta_1$ and $\theta_2$ with respect to the directions of propagation of the acoustic surface waves represented by wave vectors $\vec{k}_1$ and $\vec{k}_2$, a portion of the acoustic surface waves generated thereby and represented by wave vectors $\vec{k}_1$ and $\vec{k}_2$, respectively, will be reflected at the edges of the interaction region 14. Accordingly, at any one instant in time only a portion of the acoustic beam or wave is in the interaction region. This results in a lower convolution efficiency than the device described in U.S. Pat. No. 3,833,867 operating under otherwise similar conditions, where the convolution efficiency F is defined as $$F = P_3/P_1P_2 \qquad 15.$$

and where $P_3$ is the output power and $P_1$ and $P_2$ are the respective input powers. However, it should be noted that this is not a serious disadvantage since it is possible to compensate for the lower efficiency with a higher amplification of the surface waves as they propagate through the interaction region 14.

In addition to eliminating dispersive effects of the interaction region 14, the disposition of the interaction region 14 at angles with respect to the launching input transducers 12 and 13 reduces to some extent undesired reflections in the device. Specifically, since none of the edges or structural lines are parallel to a wavefront of the propagating acoustic surface waves, reflections therefrom will be directed away from the paths traversed by the propagating acoustic surface waves. Therefore, the device will inherently yield improved spurious signal suppressions with respect to, for example, the device disclosed in U.S. Pat. No. 3,833,867.

Figure 2:
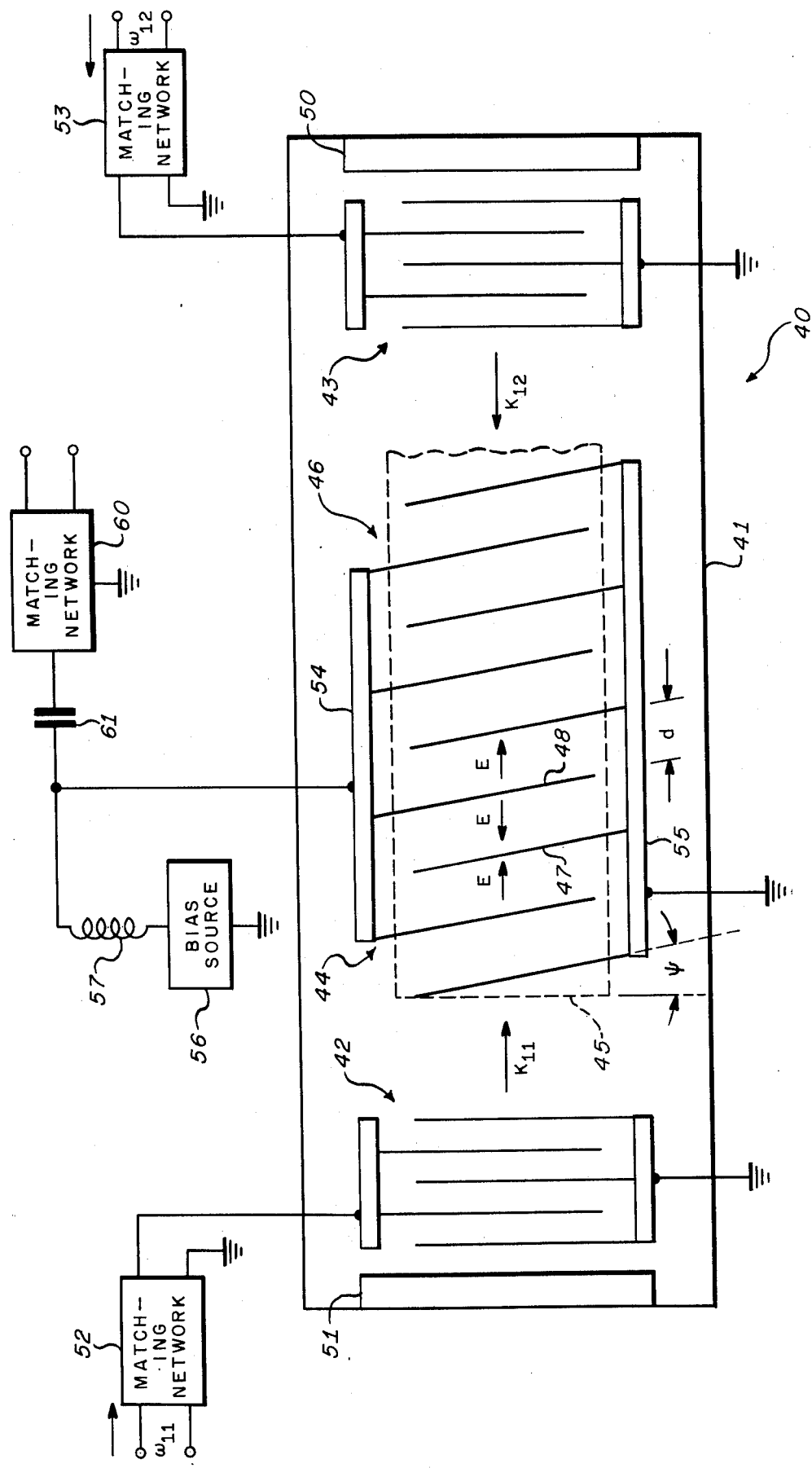
FIG. 2 is an illustration of another embodiment of the present invention partly comprising a block-schematic diagram and partly comprising a plan-view of the convolver in which the conductor array is disposed at an angle with respect to the directions of propagation of the acoustic surface waves.

Referring now to FIG. 2, a second embodiment 40 of the present invention is illustrated. In particular, the body or substrate 41, preferably formed from an elongate slab of y-cut LiNbO$_3$ is utilized as the medium over which the acoustic surface waves will propagate. Similar to the first embodiment illustrated in FIG. 1, a pair of launching input transducers 42 and 43, fabricated in a manner similar to that described in U.S. Pat. No. 3,833,867, are disposed at either end of the substrate 41. In response to appropriate input signals, launching input transucers 42 and 43, each generate an acoustic surface wave which will propagate along the substrate 41 in the directions indicated by wave vectors $\vec{k}_{11}$ and $\vec{k}_{12}$, respectively.

An output structure or interaction region 44 is formed on the substrate 41 by the disposition of a thin semiconductor film overlay 45, preferably CdSe, thereon, in the manner described in U.S. Pat. No. 3,833,867. Situated on the top of the semiconductor film 45 is a conductive array 46 of regularly spaced interdigital electrode fingers, such as electrodes 47 and 48, which are fabricated in a manner similar to that utilized for the construction of input transducers 42 and 43. In the alternative, the combination of the piezoelectric substrate 41 and the semiconductor film 45 may be replaced by a single layer of active material displaying both piezoelectric and semiconductor properties such as, for example CdS or GaAs as more fully described in U.S. Pat. No. 3,833,867.

A pair of acoustic absorbers 50 and 51, which may be fabricated from a thin film of suitable acoustic absorbing materials such as wax, rubber, etc. are situated at either end of the substrate 41. The acoustic absorbers 50 and 51 are utilized to absorb the undesired acoustic waves generated by input transducers 42 and 43.

The input signals represented by their respective frequencies $\omega_{11}$ and $\omega_{12}$, which will be convolved by the apparatus are coupled to conventional matching network circuits 52 and 53, respectively. The output from matching network 52 is coupled to launching input transducer 42 and, similarly, the output from matching network 53 is coupled to launching input transducer 43. A pair of buss bars or conductors 54 and 55, are fabricated by the same technique utilized with respect to the electrode fingers of the conductive array 46, are each separately coupled to alternate electrode fingers of the conductive array 46. For example, the conductor 54 is coupled to electrode 48 while conductor 55 is coupled to electrode 47.

A bias voltage is applied across the conductors 54 and 55, as described in U.S. Pat. No. 3,833,867 to amplify or more appropriately to minimize attenuation of the propagating acoustic surface waves in the interaction region 44. The bias voltage, which may be direct or pulsating, is provided by bias source 56 and coupled to electrodes 54 and 55 through inductor 57. Since the conductors 54 and 55 also sum the components of the product of convolution signals, a matching network 60 is coupled thereto to detect the desired convolution signal represented by $\omega_{13}$, where $\omega_{13} = \omega_{11} + \omega_{12}$. A blocking capacitor 61, serially coupled between matching network 60 and conductor 55, is utilized to block or isolate from the output or convolution signal, the d.c. bias voltage generated by bias source 56.

As indicated in the Description of the Prior Art, convolvers similar to the device described in U.S. Pat. No. 3,833,867, are subject to deterioration in the convolution or output signal as a result of spurious signals induced in the device. In particular, portions of the acoustic waves generated by the launching input transducers and propagating in the interaction region will be reflected by the electrode fingers of the conductive array. In the prior art, the electrode fingers of the conductive array are disposed parallel to the wavefronts of the propagating surface acoustic waves. Therefore, reflections therefrom are substantially directed along the same paths traversed by the acoustic surface waves generated by the launching input transducers. These reflections have proved extremely difficult to eliminate if the device is operated in the non-degenerate mode, i.e., where $\omega_{11} \neq \omega_{12}$, since the electrode fingers of the conductive array must be disposed perpendicularly with respect to the wave vector of the output or convolution signal.

In the embodiment depicted in FIG. 2, the convolver is operated in the degenerate mode and, in cooperation with the bidirectional amplification technique disclosed in U.S. Pat. No. 3,833,867, the distortion effects of the reflections in the interaction region 44 may be substantially eliminated.

In FIG. 2, the electrode fingers of the conductive array 46 are uniformly disposed at an angle or skewed with respect to the wavefronts from the acoustic surface waves generated by launching transducers 42 and 43. As described in greater detail in U.S. Pat. 3,833,867, the alternating unidirectional electric fields, partially represented in FIG. 2 by the arrows labelled E, result in successive amplifications and attenuations of the surface acoustic waves introduced in the interaction region depending on the direction thereof. However, the gain in the segments where the surface acoustic waves are amplified substantially exceeds the loss in the segments where the surface acoustic wave is attenuated thereby resulting in a net gain over the course of the interaction region 44.

In FIG. 2, the electrodes are disposed at an angle $\psi$ with respect to the wavefronts of the propagating surface acoustic waves. Accordingly, the bias voltage applied to conductors 54 and 55 must be increased by a factor of $(\cos \psi^{-1})$, in order to obtain an equivalent amount of amplification with respect to the device shown in U.S. Pat. No. 3,833,867.

As disclosed in the aforementioned patent, a segment which is forward-biased with respect to the surface acoustic wave generated by launching transducer 42 is reversed-biased with respect to the surface acoustic wave generated by the launching transducer 43. Therefore, the same segment or region will simultaneously amplify the acoustic surface wave generated by launching transducer 42 and attenuate the acoustic surface wave generated by launching transducer 43. Conversely, the opposite effect occurs in the adjacent regions. Accordingly, both propagating acoustic surface waves reach a relative maximum amplitude at every electrode connected to the positive or high potential terminal of the bias source 56. Correspondingly, each surface wave reaches a relative minimum amplitude at every electrode connected to the negative or low potential terminal of the bias source 56.

As already noted, the device is operating in the degenerate mode; therefore $\omega_{11} = \omega_{12}$. The frequency of the product of convolution signal is therefore equal to $2\omega_{11}$ (or $2\omega_{12}$) and is proportional to the product of the surface wave amplitudes at each point along the interaction region. Accordingly, the product or convolution signal reaches relative maximum at each of the electrodes connected to the positive bias terminal and a relative minimum at each electrode connected to the negative bias terminal. Since the two input frequencies are equal, the wave vector of the product of convolution signal is zero and the phase of the product of convolution signal is uniform along the entire interaction region. The result is, that the integral of the product signal, which is the convolution or output signal, appears across the interdigital conductive array of electrode fingers regardless of the angle $\psi$ or amount of skew of the electrode fingers and regardless of the periodicity of the electrode fingers. Accordingly, the electrodes may be skewed at any desirable angle and the center-to-center spacing between successive electrode fingers may be arbitrarily chosen since it is independent of the input frequencies.

It can be appreciated that because of the angle of skew ψ of the electrode fingers, reflections therefrom will be directed away from the paths traversed by the propagating acoustic surface waves and will therefore not add to the spurious signal distortion of the output or convolution signal. As a result, the device of FIG. 2 operating the degenerate mode yields significantly higher convolution efficiencies and time bandwidth TB products than the prior art. Additionally, a film-on-substrate center structure or interaction region of the convolver depicted in FIG. 2, operating in the degenerate mode may be skewed similarly to the embodiment illustrated in FIG. 1 to eliminate the effects of dispersions and increase the time bandwidth TB thereof.

While the invention has been described in its preferred embodiment, it is to be understood that the words which have been used are words of description rather than limitation, and that changes may be made within the purview of the appended claims without departing from the true scope and spirit of the invention in its broader aspects.

I claim:

1. A signal convolver including a body having an active surface means with piezoelectric properties for propagating first and second acoustic surface waves introduced at opposite ends thereof, comprising:
   layer means having semiconductor properties and disposed on said active surface means for forming an interaction region therewith, wherein first and second refracted acoustic surface waves are introduced therein in response to the propagation of said first and second acoustic surface waves,
   conductive array means disposed in said interaction region and including regularly spaced electrode finger means supporting alternating unidirectional electric fields of substantially equal magnitude between successive pairs of said electrode finger means for amplifying said first and second refracted acoustic surface waves, and wherein said electrode finger means are uniformly situated at an angle, other than 90°, with respect to the directions of propagation of said first and second acoustic surface waves, and
   summing means coupled to said conductive array means for sensing a sum frequency signal equal to the sum of the frequencies of said first and second refracted acoustic surface waves.

2. The apparatus as set forth in claim 1 wherein said signal convolver further includes first and second launching means disposed at opposite ends of said active surface means for launching said first and second acoustic surface waves, respectively.

3. The apparatus as set forth in claim 2 wherein said first and second launching means are each comprised of a planar interdigital array of regularly spaced electrode finger means.

4. The apparatus as set forth in claim 3 wherein said layer means is comprised of a substantially rectangular semiconductor film disposed on said active surface means at a first angle with respect to the direction of propagation of said first acoustic surface wave, and at a second angle with respect to the direction of propagation of said second acoustic wave.

5. In the signal convolver described in claim 4 wherein the frequencies of said first and second acoustic surface waves are unequal and the wave vectors of said first and second refracted acoustic surface waves each have a dispersive and a non-dispersive component, the apparatus as set forth in claim 4 wherein:
   said first and second angles are selected such that the dispersive component of the wave vectors of said first and second refracted acoustic surface waves substantially cancel, and
   the angle formed by said electrode finger means with respect to the direction of propagation of said first and second acoustic surface waves is normal to the non-dispersive component of the wave vectors of said first and second refracted acoustic surface waves.

6. The apparatus as set forth in claim 5 wherein each electrode finger means is spaced one-half wavelength from the preceding and succeeding electrode finger means with respect to the electric field distribution of the summation frequency signal.

7. In the signal convolver described in claim 4 wherein the frequencies of said first and second acoustic surface waves are equal, the apparatus as set forth in claim 4 wherein said first and second angles are equal.

8. The apparatus as set forth in claim 3 wherein the frequencies of said first and second acoustic surface waves are equal.

9. The apparatus as set forth in claim 8 wherein the spacing between successive electrode finger means is independent of the sum and difference frequencies of said first and second acoustic surface waves.

10. The apparatus as set forth in claim 3 wherein said summing means includes a first conductor means coupled to alternate units of said electrode finger means and a second conductor means coupled to the remaining units of said electrode finger means.

11. A signal convolver including a body having an active surface means for propagating first and second acoustic surface waves introduced at opposite ends thereof for convolving said first and second acoustic waves with minimal dispersion comprising:
   layer means having semiconductor properties and disposed on said active surface means at a first angle with respect to the direction of propagation of said first acoustic surface wave and at a second angle with respect to the direction of propagation of said second acoustic wave for forming an interaction region with said active surface means wherein first and second refracted acoustic surface waves are introduced therein in response to the respective propagations of said first and second acoustic surface waves each having a wave vector with a dispersive and a non-dispersive component and wherein said first and second angles are selected so that the dispersive components of the wave vectors of said first and second refracted acoustic surface waves substantially cancel; and
   transducer means at least partially disposed in said interaction region for sensing a sum frequency signal therein comprised of the sum of the frequencies of said first and second refracted acoustic surface waves.

12. The apparatus as set forth in claim 11 wherein said layer means is comprised of a generally rectangular semiconductor film having a first edge situated such that it is impinged by said first acoustic surface wave and a second edge parallel to said first edge and situated such that it is impinged by said second acoustic surface wave and wherein the non-dispersive components of the wave vectors of said first and second refracted acoustic surface waves are parallel to said first and second edges.

13. The apparatus as set forth in claim 12 wherein said transducer means includes conductive array means disposed in said interaction region and comprising regularly spaced electrode finger means for detecting the summation frequency signal and for supporting alternating unidirectional electric fields of substantially equal magnitude between successive pairs of said electrode finger means with which said first and second refracted acoustic surface waves are amplified.

14. The apparatus as set forth in claim 13 wherein the frequencies of said first and second acoustic surface waves are unequal and each electrode finger means is disposed perpendicularly with respect to the direction of the non-dispersive components of the wave vectors of said first and second refracted acoustic waves.

15. The apparatus as set forth in claim 14 wherein each electrode finger means is spaced one-half wavelength with respect to the electric field distribution of the sum frequency signal from the preceding and succeeding electrode finger means.

16. The apparatus as set forth in claim 13 wherein the frequencies of the first and second acoustic surface waves are equal and said first and second angles are equal.

17. The apparatus as set forth in claim 13 wherein said transducer means further includes first conductor means coupled to alternate units of said electrode finger means and second conductor means coupled to the remaining units of said electrode finger means.

18. A signal convolver including a body having an active surface means for propagating first and second acoustic surface waves each having the same frequency and introduced at opposite ends of said body and an interaction region having cooperative semiconductor and piezoelectric properties comprising:
   conductive array means disposed in said interaction region and including regularly spaced electrode finger means supporting alternating unidirectional electric fields of substantially equal magnitude between successive pairs of said electrode finger means for amplifying said first and second acoustic surface waves and wherein said electrode finger means are uniformly situated at an angle, other than 90°, with repsect to the direction of propagation of said first and second acoustic surface waves whereby acoustic surface wave reflections therefrom are directed away from the paths traversed by said first and second acoustic surface waves; and
   summing means coupled to said conductor array means for sensing a sum frequency signal equal to the sum of the frequencies of said first and second acoustic surface waves.

19. The apparatus as set forth in claim 18 wherein the spacing of said electrode finger means is independent of the sum and difference frequencies of said first and second acoustic surface waves.

20. The apparatus as set forth in claim 18 wherein said body is comprised of a piezoelectric substrate and said interaction region is formed from the deposition of a semiconductor film thereon.

21. The apparatus as set forth in claim 18 wherein said body is comprised of a piezoelectric semiconductor material.

22. The apparatus as set forth in claim 18 wherein said summing means includes first conductor means coupled to alternate units of said electrode finger means and second conductor means coupled to the remaining units of said electrode finger means.

* * * * *